United States Patent
West et al.

(10) Patent No.: US 9,096,927 B2
(45) Date of Patent: Aug. 4, 2015

(54) COOLING RING FOR PHYSICAL VAPOR DEPOSITION CHAMBER TARGET

(75) Inventors: Brian West, San Jose, CA (US); Goichi Yoshidome, Emeryville, CA (US); Ralf Hofmann, Soquel, CA (US)

(73) Assignee: APPLIED MATERIALS, INC., Santa Clara, CA (US)

(\*) Notice: Subject to any disclaimer, the term of this patent is extended or adjusted under 35 U.S.C. 154(b) by 141 days.

(21) Appl. No.: 13/584,972

(22) Filed: Aug. 14, 2012

(65) Prior Publication Data

US 2013/0056347 A1 Mar. 7, 2013

Related U.S. Application Data

(60) Provisional application No. 61/530,922, filed on Sep. 2, 2011.

(51) Int. Cl.
*C23C 14/35* (2006.01)
*C23C 14/34* (2006.01)
*H01J 37/34* (2006.01)

(52) U.S. Cl.
CPC ......... *C23C 14/3407* (2013.01); *H01J 37/3414* (2013.01); *H01J 37/3497* (2013.01)

(58) Field of Classification Search
CPC ............ H01J 37/3497; C23C 14/3407
USPC .................................................. 204/298.09
See application file for complete search history.

(56) References Cited

U.S. PATENT DOCUMENTS

| | | | |
|---|---|---|---|
| 4,060,470 A * | 11/1977 | Clarke ..................... 204/192.12 |
| 5,876,573 A * | 3/1999 | Moslehi et al. .......... 204/192.12 |
| 5,953,827 A | 9/1999 | Or et al. |
| 6,039,848 A | 3/2000 | Moslehi et al. |
| 6,228,236 B1 | 5/2001 | Rosenstein et al. |
| 6,641,701 B1 * | 11/2003 | Tepman ..................... 204/192.1 |
| 6,689,254 B1 | 2/2004 | Hurwitt |
| 7,102,292 B2 * | 9/2006 | Parsons et al. ........... 315/111.21 |

FOREIGN PATENT DOCUMENTS

JP 10-287975 A 10/1998

OTHER PUBLICATIONS

International Search Report and Written Opinion mailed Jan. 17, 2013 for PCT Application No. PCT/US2012/052680.

\* cited by examiner

*Primary Examiner* — Jason M Berman
(74) *Attorney, Agent, or Firm* — Moser Taboada; Len Linardakis

(57) ABSTRACT

Apparatus and method for physical vapor deposition are provided. In some embodiments, a cooling ring to cool a target in a physical vapor deposition chamber may include an annular body having a central opening; an inlet port coupled to the body; an outlet port coupled to the body; a coolant channel disposed in the body and having a first end coupled to the inlet port and a second end coupled to the outlet port; and a cap coupled to the body and substantially spanning the central opening, wherein the cap includes a center hole.

20 Claims, 2 Drawing Sheets

COOLING RING FOR PHYSICAL VAPOR DEPOSITION CHAMBER TARGET

CROSS-REFERENCE TO RELATED APPLICATIONS

This application claims benefit of U.S. provisional patent application Ser. No. 61/530,922, filed Sep. 2, 2011, which is herein incorporated by reference.

FIELD

Embodiments of the present invention generally relate to physical vapor deposition processing equipment.

BACKGROUND

Physical vapor deposition (PVD) is a conventionally used process for deposition of materials atop a substrate. A conventional PVD process illustratively includes bombarding a target comprising a source material with ions from a plasma, causing the source material to be sputtered from the target. The ejected source material may be accelerated towards the substrate via a negative voltage or bias formed on the substrate, resulting in a deposition of the source material atop the substrate. During the PVD process a magnetron may be rotated within a water filled cavity, near a backside of the target, to promote uniformity of the plasma. The water-filled cavity is used to remove heat generated during processing. However, the water filled cavity hinders the serviceability of the magnetron and interferes with the feed of RF energy through the surrounding structure to the target.

Accordingly, the inventors have provided an improved apparatus to perform physical vapor deposition processing.

SUMMARY

Apparatus and methods for physical vapor deposition are provided. In some embodiments, a cooling ring to cool a target in a physical vapor deposition chamber may include an annular body having a central opening; an inlet port coupled to the body; an outlet port coupled to the body; a coolant channel disposed in the body and having a first end coupled to the inlet port and a second end coupled to the outlet port; and a cap coupled to the body and substantially spanning the central opening, wherein the cap includes a center hole.

In some embodiments, a target assembly for use in a physical vapor deposition system may include a target including a source material to be deposited on a substrate; a cooling ring coupled to the target and having one or more coolant channels disposed in the cooling ring to flow a coolant through the coolant ring; a central cavity adjacent a backside of the target at least partially defined by inner walls of the cooling ring; and a rotatable magnet assembly disposed within the cavity.

In some embodiments, a method of processing a substrate in a physical vapor deposition chamber may include sputtering material from a target disposed in the physical vapor deposition chamber to deposit the material on the substrate supported within the physical vapor deposition chamber; and flowing a coolant through a coolant channel disposed in a body of a cooling ring coupled to a side of the target opposite the substrate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
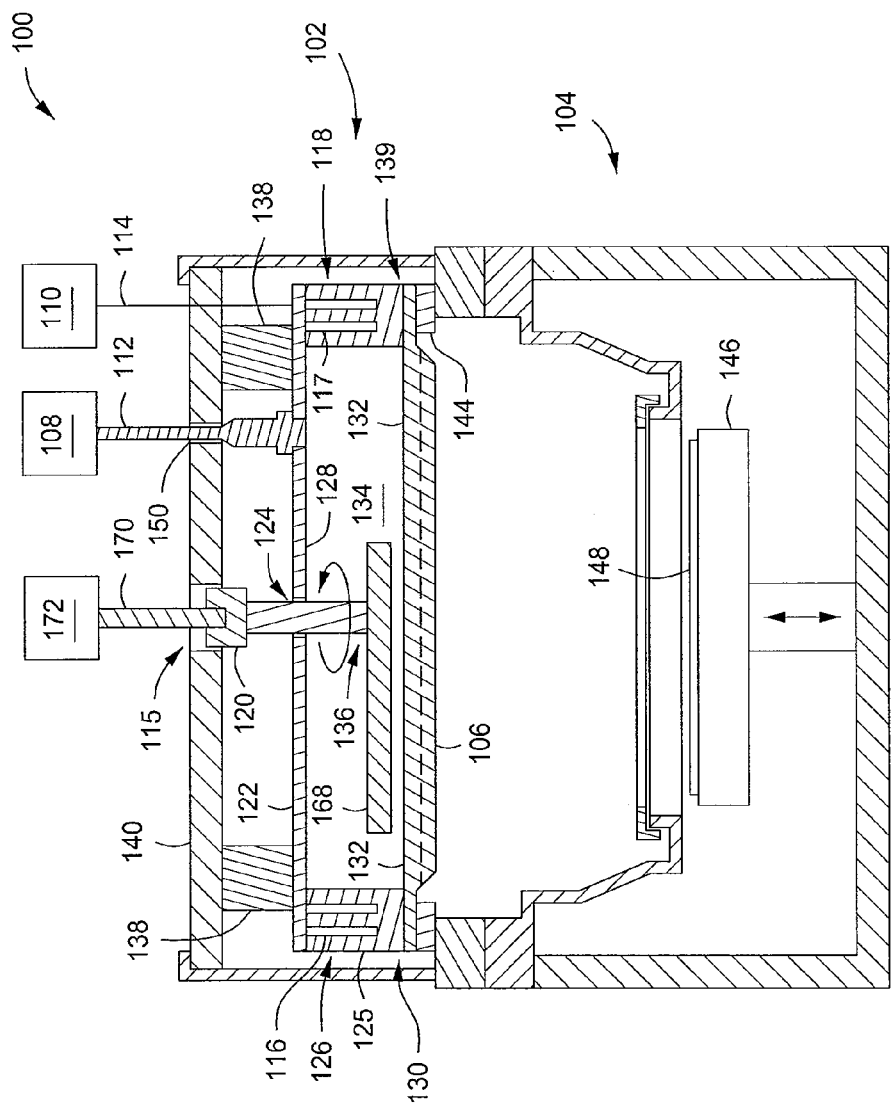
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for physical vapor deposition (PVD) processing of substrates are provided herein. In some embodiments, the improved apparatus may eliminate the need for a water cavity in a PVD chamber resulting in improved RF efficiency and in simplifying removal of a target and magnetron assembly for example, during maintenance or when installing and/or replacing a target.

FIG. 1 depicts a schematic, cross-sectional view of a physical vapor deposition (PVD) chamber 100 in accordance with some embodiments of the present invention. Examples of suitable PVD chambers include the ALPS® Plus and SIP ENCORE® PVD processing chambers, both commercially available from Applied Materials, Inc., of Santa Clara, Calif. Other processing chambers from Applied Materials, Inc. or other manufactures may also benefit from the inventive apparatus disclosed herein.

In some embodiments of the present invention, as depicted in FIG. 1, the PVD chamber 100 includes a target assembly 102 disposed atop a process chamber 104. The process chamber 104 contains a movable substrate support 146 for supporting a substrate 148 in a position opposing the target assembly 102.

The target assembly 102 may be incorporated into a lid of the process chamber 104 and generally includes a target 106 and a cooling ring 118 coupled to the target 106. The cooling ring 118 partially defines a cavity 134 adjacent to a backside of the target 106. The target assembly may further include a rotatable magnetron assembly 136 having a rotatable magnet assembly 168 disposed in the cavity 134. The target assembly 102 may further comprise an RF power source 108 to provide RF energy to the target 106 during processing. In some embodiments, an electrode 112 (e.g., an RF applicator rod) may be provided to couple the RF power source 108 to the target 106 via the cooling ring 118. For example, in some embodiments, the electrode 112 may pass through an opening in an outer ground shield 140 that surrounds the target assembly 102 and may be coupled to the cooling ring 118. The RF power source 108 may include an RF generator and a matching circuit, for example, to minimize reflected RF energy reflected back to the RF generator during operation.

During operation, heat generated by the process is removed by the cooling ring 118. Although described herein in terms of a ring, the cooling ring 118 need not be circular and may have other geometries, such as rectangular or other polygonal shapes, as desired for a particular process chamber configuration. By removing heat from the process via the cooling ring, as compared to a water filled cavity, this design advantageously removes undesirable consequences of having a water filled cavity. For example, use of the cooling ring makes changing the target and magnet of the source significantly simpler by eliminating the need to drain the coolant from the closed cavity behind the target for maintenance. Also, In the case of target burn through, there is no danger of flooding the chamber with the coolant. Moreover, RF efficiency is improved as RF energy is not wasted through absorption by the water-filled cavity behind the target.

In some embodiments, the cooling ring 118 includes a body 125 having one or more coolant channels 116, 117 disposed therein. In some embodiments, the body 125 may be annular. In some embodiments, the coolant channels 116, 117 are disposed proximate a circumference of the body 125. The number of coolant channels and their geometry may be determined as desired for a particular process, taking into consideration the structural requirements of the cooling ring to support any other components.

A coolant source 110 may be coupled to the cooling ring 118 via one or more conduits 114 disposed through an opening in the ground shield 140 to provide a coolant to the coolant channels 116, 117. The coolant may be any process compatible coolant, such as ethylene glycol, deionized water, a perfluorinated polyether (such as Galden®, available from Solvay S. A.), or the like, or combinations thereof. In some embodiments, the flow of coolant through the coolant channels 116, 117 may be about 1 to about 7 gallons per minute, although the exact flows will depend upon the process being performed, the configuration of the coolant channels, available coolant pressure, or the like.

In some embodiments, a cap 122 may be coupled to the body 125 to cover the coolant channels 116, 117. The cap 122 may be coupled to the body 125 in any suitable manner to prevent leakage of the coolant. In some embodiments the cap 122 may be coupled to the body 125 by vacuum or non-vacuum brazing, electron beam welding, adhesives or other bonding agents, or the like. In some embodiments, the cap 122 may be a plate or disc having a central opening 124 to facilitate receiving a shaft 170 of the magnetron assembly 136. Alternatively, an insert (not shown) may be provided to seal the one or more coolant channels 116, 117. In some embodiments, the insert may be welded into the one or more coolant channels 116, 117 beneath the cap 122 by any suitable method, such as e-beam welding, tig welding, laser welding, brazing, or the like.

In some embodiments, the body 125 and the cap 122 may be fabricated from at least one of copper, aluminum, bronze, brass, stainless steel, alloys thereof (such as a copper chrome alloy), or the like. The body 125 and the cap 122 may be made from the same materials or from different materials. In embodiments where the body 125 and/or cap is made of aluminum, a corrosion prevention coating may be applied to the coolant channels 116, 117, and optionally to the surface of the cap 122 exposed to the coolant channels 116, 117, to prevent corrosion from the coolant. An example of one such coating is Alodine®, a registered trademark of Henkel Technologies. In some embodiments, exterior surfaces of the body 125 and the cap 122 may be silver plated, for example, to enhance RF conductivity of the body 125 and the cap 122.

Figure 2A:
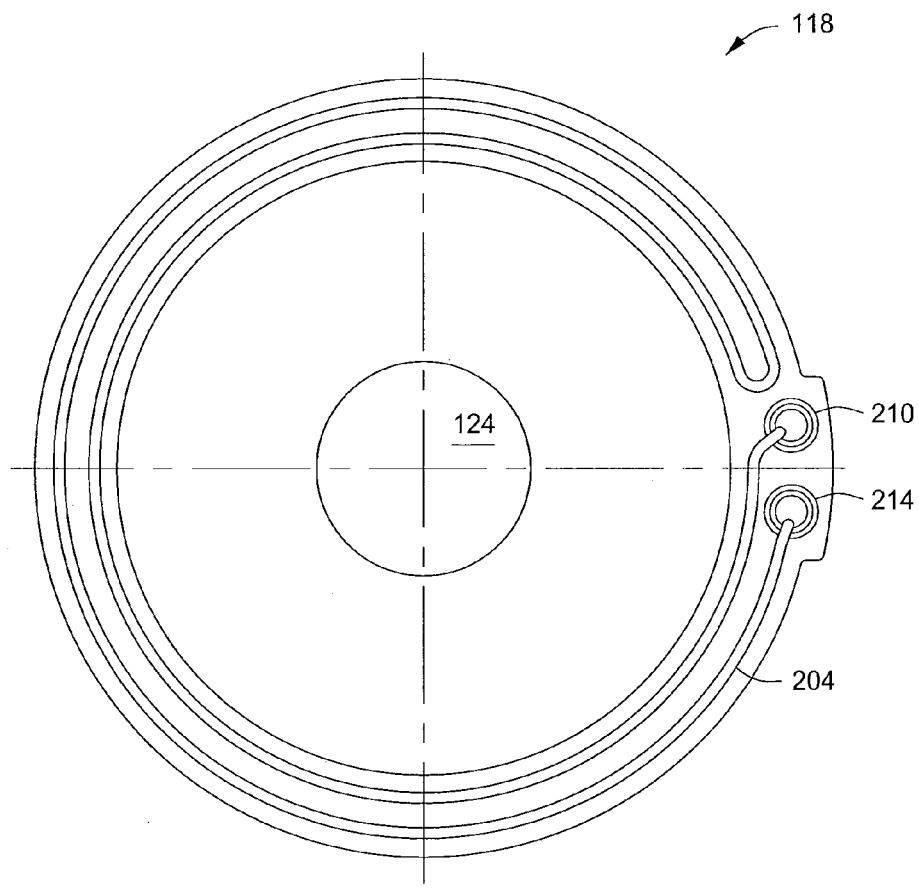
FIG. 2A depicts a schematic top view of a cooling ring in accordance with some embodiments of the present invention.
Figure 2B:
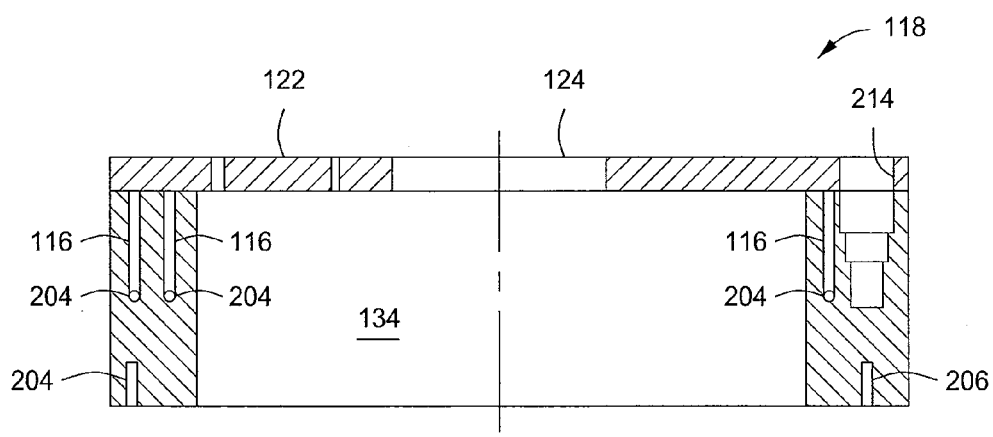
FIG. 2B depicts a side cross-sectional view of a cooling ring in accordance with some embodiments of the present invention.

FIG. 2A depicts a schematic bottom view of a cooling ring 118 including a coolant channel 116 in accordance with some embodiments of the present invention. FIG. 2B depicts a cross-sectional side view of the cooling ring 118 including the coolant channel 116 in accordance with some embodiments of the present invention.

Referring to FIGS. 2A-B, in some embodiments, one or more coolant inlet ports (one inlet port 210 shown in FIG. 2A) and one or more coolant outlet ports (one outlet port 214 shown in FIG. 2A) may be provided through the cap 122 and/or the body 125 to facilitate circulating the coolant through the coolant channel 116. In some embodiments, the coolant channel 116 may include a conduit 204 in close thermal contact with the body 125 to contain the coolant. In some embodiments, the conduit 204 may be made of stainless steel, copper, brass, bronze, or the like. In some embodiments, the conduit 204 may be disposed within an outer cladding or body (not shown) that may be press fit into the coolant channel 116 to ensure superior thermal contact between the conduit 204 and the sidewalls of the coolant channel 116. For example, in some embodiments, stainless steel tubing may be embedding into castings and press fit into the coolant channel 116. In some embodiments, the conduit 204 may be swaged or brazed into a part, such as an aluminum body, to enhance thermal connectivity. In some embodiments, the coolant channel 116, or the conduit 204 disposed therein, may be provided in a loop or other similar configuration that provides a counter flow of the coolant in adjacent coolant channel 116 or conduit 204. Such counter flow configuration may advantageously enhance heat removal from the cooling ring 118.

The body 125 may be coupled to the target 106 in any suitable fashion to provide a robust thermal coupling, such as by bolts or other fasteners, clamps, springs, gravity, or the like. In some embodiments, a plurality of holes 206 may be provided in the body 125 (as shown in FIG. 2B) to facilitate bolting the target 106 to the body 125. In some embodiments, thermal connectivity between components may be enhanced using a thermal foil, such as a patterned copper or aluminum foil, Grafoil® (available from GrafTech International), or the like, as a thermal conductor. The patterned copper or aluminum foil may be pressed over a screen to form a patterned surface including a plurality of raised surfaces to add a conformal aspect to the foil.

Returning to FIG. 1, the cooling ring 118 may be coupled to the target 106 at a second end 130 of the body 125. In some embodiments, the body 125 may be a tubular member having a first end 126 coupled to a target-facing surface 128 of the cap 122 proximate the peripheral edge of the cap 122. In some embodiments, the body 125 further includes a second end 130 coupled to a cap-facing surface 132 of the target 106 (or to a backing plate 146 of the target 106) proximate the peripheral edge of the target 106. In some embodiments, second end 130 contacting the perimeter of the target has a width in the range of 0.75 inches to 2 inches. In some embodiments, the target 106, when in place in the process chamber, may further be supported on a grounded conductive aluminum adapter 142 through a dielectric isolator 144.

In some embodiments, an isolator plate 138 may be disposed between the cap 122 and the ground shield 140 to prevent RF energy from being routed directly to ground. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

In some embodiments, the cavity 134 may be defined by the inner-facing walls of the body 125, the target-facing surface 128 of the cap 122 and the cap-facing surface 132 of the target 106. The cavity 134 and the central opening 115 may be utilized to at least partially house one or more portions of the rotatable magnetron assembly 136. As used herein, inner-facing walls is stated in plural but include the singular such as when the body 125 is annular.

For example, the rotatable magnetron assembly 136 may be positioned proximate a back surface (e.g., cap-facing surface 132) of the target 106 (or the backing plate 146, when present). The rotatable magnetron assembly 136 includes a rotating magnet assembly 168 comprising a plurality of magnets arranged on a base plate. The rotating magnet assembly 168 is coupled to a shaft 170 to provide rotation. In some embodiments, the shaft 170 may be coincident with the central axis of the PVD chamber 100. In some embodiments (not shown), the rotation shaft 170 may be disposed off-center with respect to the central axis of the PVD chamber 100. A motor 172 can be coupled to the upper end of the rotation shaft 170 to drive rotation of the magnetron assembly 136. The ground shield 140 has a central opening 115 to allow the rotation shaft 170 to pass through the hole 124 in the cap 122 and connect to the base plate. In some embodiments, the rotation shaft 170 contains an insulator 120 to prevent RF energy from propagating up the shaft 170 to the motor 172. The rotating magnet assembly 168 produces a magnetic field within the PVD chamber 100, generally parallel and close to the surface of the target 106 to trap electrons and increase the local plasma density, which in turn increases the sputtering rate. The rotating magnet assembly 168 produces an electromagnetic field around the top of the PVD chamber 100, and the rotating magnet assembly 168 is rotated to rotate the electromagnetic field which influences the plasma density of the process to more uniformly sputter the target 106.

In some embodiments, a ground shield 140 is shown covering at least some portions of the PVD chamber 100 above the target 106 in FIG. 1. In some embodiments (not shown), the ground shield 140 could be extended below the target 106 to enclose the process chamber 104 as well. The ground shield 140 may comprise any suitable conductive material, such as aluminum, copper, or the like. An insulative gap 139 is provided to prevent RF energy from being routed directly to ground. The insulative gap 139 may be filled with air or some other suitable dielectric material, such as a ceramic, a plastic, or the like.

While the foregoing is directed to embodiments of the present invention, other and further embodiments of the invention may be devised without departing from the basic scope thereof.

The invention claimed is:

1. A cooling ring to cool a target in a physical vapor deposition chamber, comprising:
    an annular body having a central opening and a first surface configured to be coupled to a target backing plate;
    an inlet port coupled to the body;
    an outlet port coupled to the body;
    a coolant channel disposed in the body and having a first end coupled to the inlet port and a second end coupled to the outlet port, wherein the coolant channel is configured to flow coolant through the coolant channel in an annular flow direction following a shape of the cooling ring; and
    a cap coupled to a second surface of the body and substantially spanning the central opening, wherein the cap includes a center hole, wherein the second surface of the body opposes the first surface, and wherein the cap, the annular body, and the target backing plate form a cavity when the cooling ring is coupled to the target backing plate.

2. The cooling ring of claim 1, wherein the body is made of at least one of copper, aluminum, or bronze.

3. The cooling ring of claim 2, wherein the cap is made of at least one of copper, aluminum, or bronze.

4. The cooling ring of claim 3, wherein the body and the cap are silver plated.

5. The cooling ring of claim 1, wherein the coolant channel is formed in a first surface of the body and substantially about an entire circumference of the body.

6. The cooling ring of claim 1, wherein a coolant flowed through the coolant channel to cool the target comprises at least one of ethylene glycol solution, deionized water, or a perfluorinated polyether.

7. The cooling ring of claim 1, wherein the coolant channel is configured to flow coolant through the coolant channel at about 1 to about 7 gallons per minute.

8. The cooling ring of claim 1, further comprising:
    a plurality of coolant channels disposed in the body.

9. The cooling ring of claim 1, wherein cooling channel is formed in a first surface of the body, and wherein the cap is coupled to the first surface of the body over the cooling channel to seal the coolant channel.

10. A target assembly for use in a physical vapor deposition system, comprising:
    a target comprising a source material to be deposited on a substrate and a target backing plate;
    a cooling ring coupled to the target and having one or more coolant channels disposed in a first surface of the cooling ring to flow a coolant through the coolant ring in an annular flow direction following a shape of the cooling ring, wherein a second surface of the cooling ring that opposes the first surface is coupled to the target backing plate;
    a cap coupled the first surface of the cooling ring and substantially spanning a central opening of the cooling ring, wherein the cap includes a center hole;
    a central cavity adjacent the target backing plate defined by inner walls of the cooling ring, the cap, and the target backing plate; and
    a rotatable magnet assembly disposed within the cavity.

11. The target assembly of claim 10, wherein the cooling ring further comprises:
    a body;
    a coolant inlet port coupled to the body; and
    a coolant outlet port coupled to the body.

12. The target assembly of claim 11, wherein the target is coupled to the body.

13. The target assembly of claim 11, wherein the cavity is bounded by a target-facing surface of the cap, a cap-facing surface of the target backing plate and the body of the cooling ring.

14. The target assembly of claim 11, further comprising a coolant source coupled to the coolant inlet port.

15. The target assembly of claim 14, wherein the coolant source supplies at least one of ethylene glycol solution, deionized water, or a perfluorinated polyether to the one or more coolant channels.

16. The target assembly of claim 11, further comprising an RF source coupled to the cooling ring.

17. A method of processing a substrate in a physical vapor deposition chamber, comprising:
    sputtering material coupled to a target backing plate of a target disposed in the physical vapor deposition chamber to deposit the material on the substrate supported within the physical vapor deposition chamber; and flowing a coolant through a coolant channel disposed in a body of a cooling ring in an annular flow direction following a shape of the cooling ring, wherein the cooling ring further includes:
   the body having a central opening and a first surface configured to be coupled to the target backing plate; and
   a cap coupled to a second surface of the body and substantially spanning the central opening, wherein the cap includes a center hole, wherein the second surface of the body opposes the first surface, and wherein the cap, the body, and the target backing plate form a cavity.

18. The method of claim 17, wherein the coolant channel circulates the coolant around substantially an entire circumference of the body of the cooling ring.

19. The method of claim 17, wherein the coolant is flowed through the coolant channel at a flow rate of about 1 to about 7 gallons per minute.

20. The method of claim 17, wherein the coolant flowed through the coolant channel comprises at least one of ethylene glycol solution, deionized water, or a perfluorinated polyether.

* * * * *